(12) United States Patent
Nandakumar

(10) Patent No.: US 6,362,062 B1
(45) Date of Patent: Mar. 26, 2002

(54) DISPOSABLE SIDEWALL SPACER PROCESS FOR INTEGRATED CIRCUITS

(75) Inventor: Mahalingam Nandakumar, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/655,734

(22) Filed: Sep. 6, 2000

Related U.S. Application Data

(60) Provisional application No. 60/152,751, filed on Sep. 8, 1999.

(51) Int. Cl.[7] ............................................. H04L 21/336
(52) U.S. Cl. ................... 438/303; 438/595; 438/439; 257/344; 257/408
(58) Field of Search ................. 438/303, 595, 438/439; 257/349, 408

(56) References Cited

U.S. PATENT DOCUMENTS 5,021,354 A * 6/1991 Pfiester
5,573,965 A * 11/1996 Chen et al.
5,637,514 A * 6/1997 Jeng et al. ................... 438/595
5,798,291 A * 8/1998 Lee et al. .................... 438/303
5,830,798 A * 11/1998 Dennison et al. ........... 438/439
5,994,192 A * 11/1999 Chen .......................... 438/592
6,051,863 A * 4/2000 Hause et al. ................. 257/344
6,063,698 A * 5/2000 Tseng et al. ................. 438/585

* cited by examiner

*Primary Examiner*—Trung Dang
(74) *Attorney, Agent, or Firm*—Peter K. McLarty; W. James Brady, III; Frederick J. Telecky, Jr.

(57) ABSTRACT

A method for forming a MOS transistor using a disposable sidewall spacer process. A gate dielectric (20) and a gate structure (25) is formed on a semiconductor substrate (10). Insulator films (30) and (35) and formed and a LOCOS type film (80) is formed on the substrate (10). A spacer structure (86) is formed on the gate structure (25) and implants are performed to form the source drain (50), drain extension (110), and pocket regions (120).

23 Claims, 7 Drawing Sheets

DISPOSABLE SIDEWALL SPACER PROCESS FOR INTEGRATED CIRCUITS

This application claims benefit of Prov. No. 60/152,751 filed Sep. 8, 1999.

FIELD OF THE INVENTION

The invention is generally related to the field of semiconductor device fabrication and more specifically to a method for forming high performance CMOS transistors using a disposable spacer process.

BACKGROUND OF THE INVENTION

CMOS transistors are currently fabricated using a spacer process. The spacer is used during the formation of the drain extension regions and the source and drain regions. For very short channel length transistors, the drain extension region is necessary to reduce channel hot carrier injection. Channel hot carrier injection into the gate of the transistor during operation reduces the lifetime of the device. In a typical spacer process, the transistor gate is formed by etching a blanket polycrystalline silicon film. The drain extension region is then formed by implanting the required dopant species into the silicon substrate adjacent to the gate. The drain extension region is therefore self aligned to the gate structure. Spacer structures are then formed adjacent to the gate usually with a blanket deposition of silicon nitride followed by an anisotropic nitride etch. This etch leaves nitride spacers on each side of the gate structure. In some instances, these spacer structures are referred to as sidewall spacers. Following the formation of these silicon nitride spacer structures, the source and drain regions are formed by implanting the required dopant species into the silicon substrate adjacent to the sidewall spacer. The spacer performs the function of offsetting the source and drain regions from the edge of the gate i.e., the source and drain regions are aligned to the edges of the spacers. The implanted transistor is then annealed to activate the implanted dopant species. This high temperature anneal process will cause the implanted dopants to diffuse into the silicon substrate resulting in relatively deep drain extension regions and source drain regions.

High performance short channel length CMOS transistors require shallow junctions (i.e., drain extension regions and source drain regions) and low capacitance. Capacitance present in the MOS transistor will introduce RC delays degrading performance. Shallow junctions reduce hot carrier injection and minimize short channel effects such as transistor threshold voltage roll-off. One way in which shallower junctions are achieved is to use a disposable spacer process. In this process, the sidewall spacer is formed followed by the source drain region implantation and anneals processes. The spacer is then removed and the drain extension region formed. The advantage of this method is that the drain extension region will not be annealed with the high temperature source drain process thereby minimizing the diffusion of this region. The MOS transistor is more sensitive to the depth of the drain extension region compared to the depth of the source drain region. While resulting in a shallow drain extension region, the above disposable spacer method does not reduce the capacitance present in the transistor. There is therefore a need for a method that produces both shallow junctions and low capacitance for improved MOS transistor performance.

SUMMARY OF THE INVENTION

The instant invention is a method of forming a MOS transistor using novel spacer technology. The invention results in MOS transistors with low capacitance and therefore improved performance compared to the prior art. In an embodiment of the instant invention, the method comprises: providing a semiconductor substrate with an upper surface; forming a gate dielectric on said semiconductor substrate; forming a gate structure on said gate dielectric with a plurality of side surfaces and a top surface; forming a first insulator film of a first thickness on said plurality of side surfaces, said top surface, and said upper surface of said substrate; forming a plurality of sidewall structures against said first insulator film on said plurality of side surfaces wherein said sidewall structure covers a portion of said first insulator film over said upper surface of said substrate; forming a LOCOS type insulator film of a second thickness on said upper surface of said semiconductor substrate wherein said second thickness is greater than said first thickness and said LOCOS type insulator film is formed by thermal oxidation of said first insulator film. This embodiment further comprises: forming a source drain region beneath said LOCOS type insulator film by implanting a first dopant species; removing said plurality of sidewall structures; and forming a drain extension region and a pocket region by implanting said first dopant species and a second dopant species respectively.

In another embodiment of the invention, the method comprises: providing a semiconductor substrate with an upper surface; forming a gate dielectric on said semiconductor substrate; forming a gate structure of a first height on said gate dielectric with a plurality of side surfaces and a top surface; forming a first insulator film of a first thickness on said plurality of side surfaces, said top surface, and said upper surface of said substrate; forming a plurality of sidewall structures with a second height against said first insulator film on said plurality of side surfaces wherein said sidewall structure covers a portion of said first insulator film over said upper surface of said substrate and wherein said second height is less than said first height; forming a LOCOS type insulator film of a second thickness on said upper surface of said semiconductor substrate wherein said second thickness is greater than said first thickness and said LOCOS type insulator film is formed by thermal oxidation of said first insulator film; and forming a spacer structure on said top surface of said gate structure and on said plurality of side surfaces of said gate structure above said sidewall structure of a second height wherein said spacer structure is formed by thermal oxidation of said first insulator film. The method further comprises: forming a source drain region beneath said LOCOS type insulator film by implanting a first dopant species; removing said plurality of sidewall structures; and forming a drain extension region and a pocket region by implanting said first dopant species and a second dopant species respectively.

DETAILED DESCRIPTION OF THE INVENTION

Figure 1A:
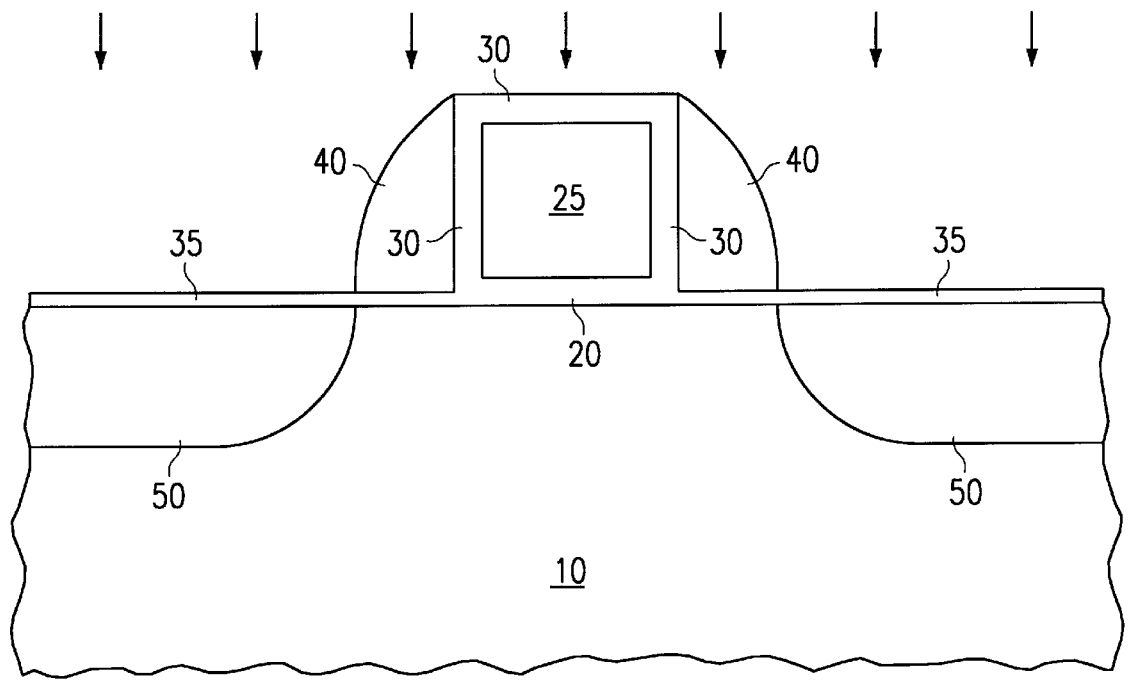
FIGS. 1A–1B are cross-sectional diagrams illustrating a disposable spacer process according to the prior art.

The prior art illustrated in FIGS. 1A and 1B will be described below. A silicon substrate 10 may be single-crystal silicon or an epitaxial silicon layer formed on a single crystal substrate as shown in FIG. 1A. Elsewhere on the substrate 10, there will be isolation structures (shallow trench isolation (STI) or LOCUS) which are not shown for clarity. A dielectric film 20 will be formed on the substrate and will serve as the gate dielectric of the MOS transistor. This gate dielectric can be silicon dioxide, silicon nitride, silicon oxynitride, or any suitable dielectric material. A blanket film of polycrystalline silicon is formed on the gate dielectric film 20 and etched to form the gate electrode 25. Following the formation of the gate electrode an oxide spacer 30 is formed either through thermal oxidation of the gate or by oxide deposition. During this spacer formation, a silicon oxide film 35 will also be formed on the substrate 10. Using standard CMQS processing a silicon nitride sidewall spacer 40 is formed by first depositing a blanket silicon nitride film followed by an anisotropic silicon nitride etch. The transistor structure is then implanted with a suitable dopant to form the source and drain regions 50. If the substrate is p-type, then n-type dopants are implanted and if the substrate is n-type , p-type dopants are used. A high temperature source drain anneal is then performed on the structure to activate the implanted dopants forming the source drain regions 50.

Figure 1B:
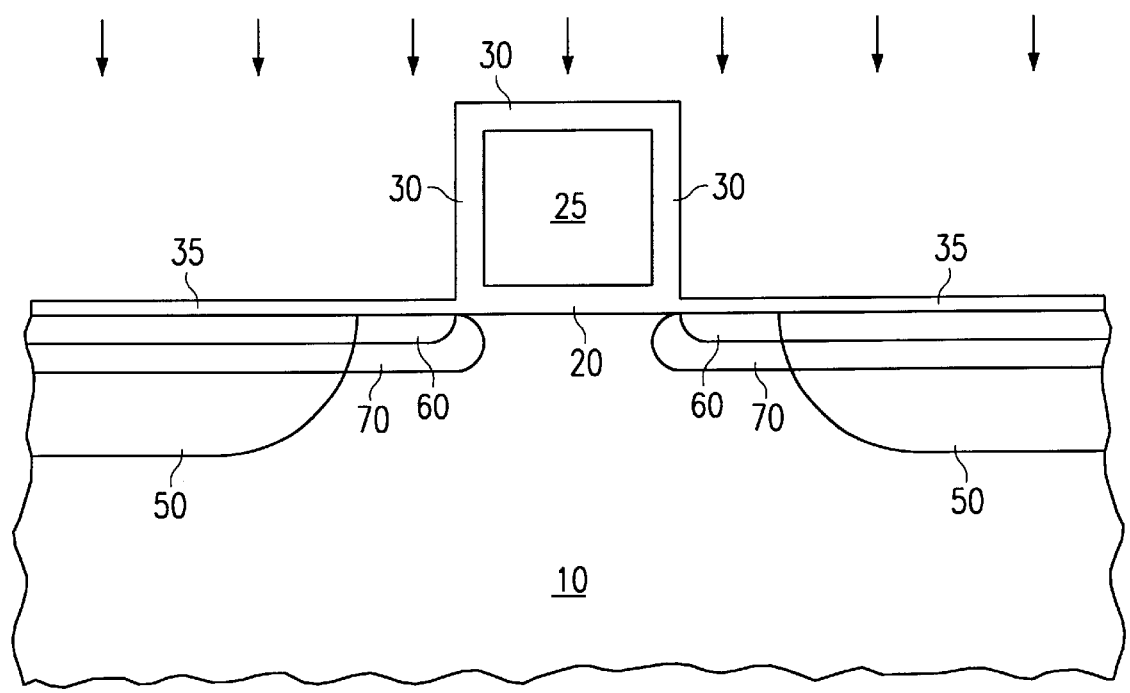

As shown in FIG. 1B, following the source drain region 50 formation, the nitride spacer is removed and additional implants are performed to form the drain extension regions 60 and the pocket regions 70. In submicron MOS transistors, these pocket regions are necessary to minimize the threshold voltage roll-off effect. For the drain extension implants, a zero degree implant is used which consists of n-type dopants if a p-type substrate is used and p-type dopants if a n-type substrate is used. The pocket regions 70 are formed using an angled implant consisting of p-type dopants for p-type substrates and n-type dopants for n-type substrates. In the structure that is shown in FIG. 1B, the drain extension region 60 and the pocket region 70 will not receive the high temperature source drain implant anneal and will therefore form shallow junctions. The structures will however have high capacitance, which will degrade transistor performance.

Figure 2A:
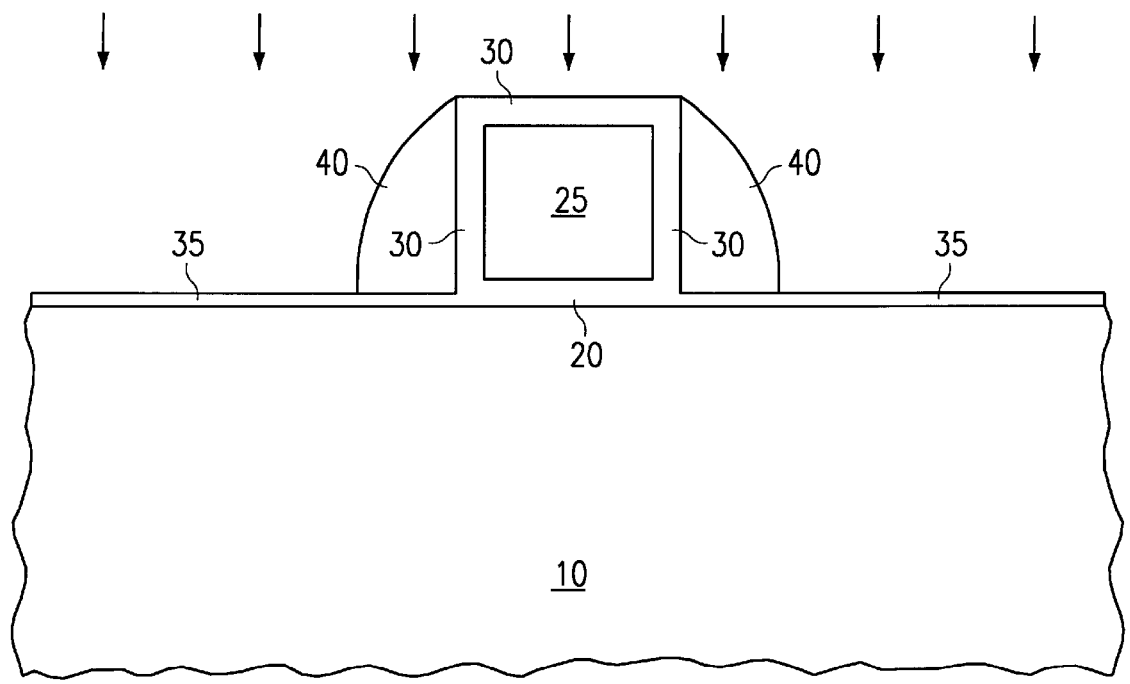
FIGS. 2A–2C are cross-sectional diagrams illustrating an embodiment of the instant invention.

The invention will now be described with reference to FIGS. 2–4. Illustrated in FIG. 2A–2C is an embodiment of the instant invention. In FIG. 2A, the gate dielectric 20 comprises silicon dioxide, silicon nitride, silicon oxynitride or a suitable dielectric film. As described above, the transistor gate structure 25 is formed by first depositing a blanket film of polycrystalline silicon followed by pattern and etch steps resulting in the structure shown. Following the formation of the gate structure 25, an oxide film is formed on the gate structure 30 and on the substrate 35 by heating the structure in an oxidizing ambient, by depositing the film, or with a combination of both processes. In an embodiment, the film thickness of 30 and 35 will be between 30 A and 50 A, more preferably about 40 A. The sidewall structures 40 are formed using silicon nitride or other suitable insulators. In the case of silicon nitride, the structures 40 are formed by first depositing a blanket silicon nitride film followed by an anisotropic silicon nitride etch.

Figure 2B:
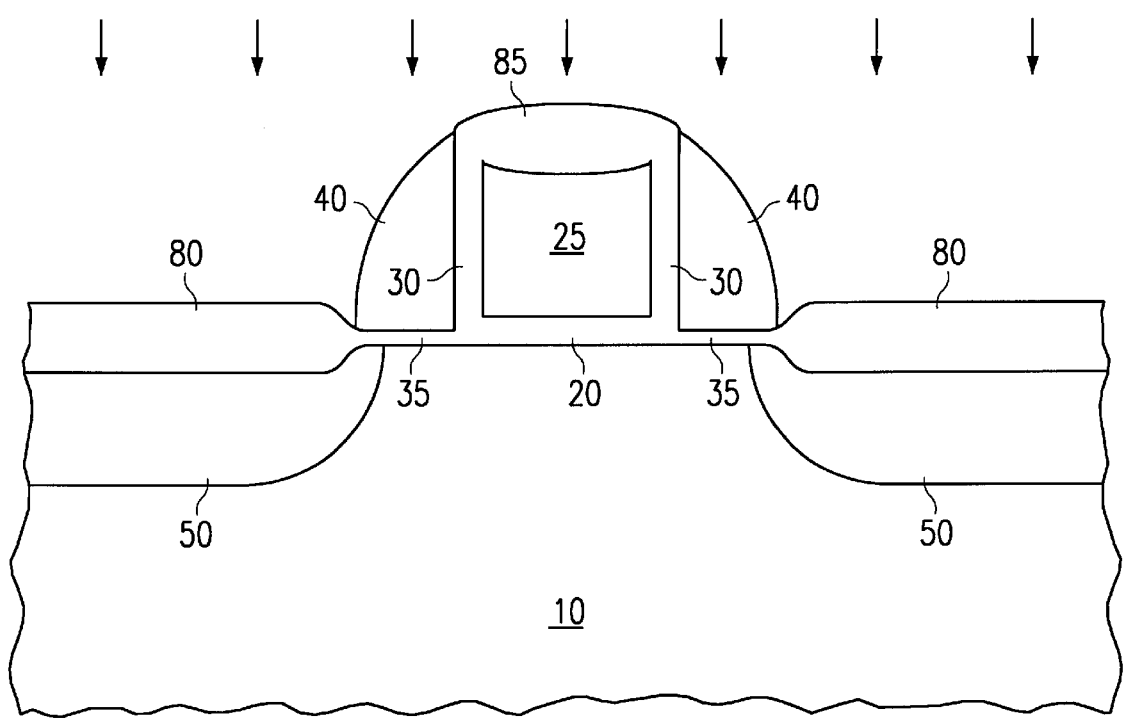

Subsequent to the formation of the sidewall structure 40, the structure shown in FIG. 2A is heated in an oxidizing ambient (thermal oxidation) to produce the LOCOS type silicon oxide region 80 shown in FIG. 2B. The silicon oxide region 85 will also be formed during this process. In regions of the substrate covered by the sidewall structure 40 and the gate structure 25, no additional silicon oxide will be formed. In an embodiment, the thickness of the LOCOS type silicon oxide region 80 will be between 150 A and 250 A and more preferably about 200 A. Following the formation of regions 80 and 85, the structure is implanted with dopant species to form the source and drain regions 50. For a p-type substrate 10, n-type dopant species such as arsenic, phosphorous, or a combination of both can be used. For a n-type substrate 10, a boron containing ion can be used. Following the implants to form the source and drain regions 50, a high temperature thermal anneal is performed to activate the implanted species.

Figure 2C:
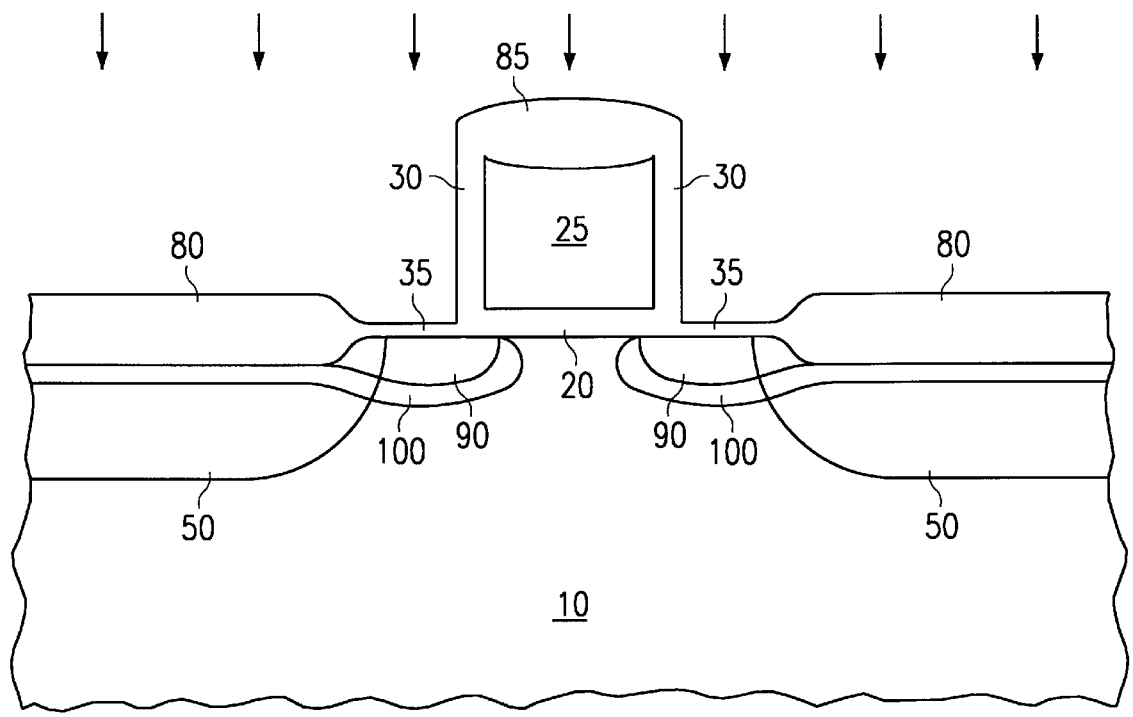

As shown in FIG. 2C, following the formation of the source and drain regions 50 in FIG. 2B, the sidewall structures 40 are removed using a highly selective silicon nitride to silicon oxide etch. This high selective etch is necessary to minimize the silicon oxide loss from region 80 during this process. Following the removal of the sidewall structures 40, the drain extension implants and the pocket implants are performed resulting in the formation of the drain extension region 90 and the pocket region 100 respectively. For a p-type substrate 10, n-type species such as arsenic and phosphorous and be used to form the drain extension region 90 and a p-type species such as a boron containing ion can be used to form the pocket region 100. If a n-type substrate 10 is used, a p-type species such a boron containing ion can be used to form the drain extension region 90 and n-type species such as arsenic or phosphorous can be used to form the pocket region 100. Following the implantation processes used to form regions 90 and 100, a low temperature anneal (or a rapid thermal anneal) is performed to activate the dopants.

The presence of the thick LOCOS type silicon oxide region 80 during the drain extension and pocket implants will cause the depth of the drain extension region 90 and the pocket region 100 to decrease in regions of the substrate beneath the LOCOS type region 80. In addition to the reduction in depth, the concentration of regions 90 and 100 will be reduced in regions of the substrate 10 beneath oxide region 80 due to the loss of dopant species in this thicker oxide region 80. Due to the localized nature of oxide region 80, this region 80 will essentially cover the source and drain regions 50. The reduction in the depth and concentration of the drain extension region 90 and the pocket region 100 in the source and drain regions 50 (i.e., beneath the oxide region 80) will result in a reduction in the capacitance associated with these regions. This reduced capacitance will lead to improved performance in the resulting transistor structure.

Figure 3A:
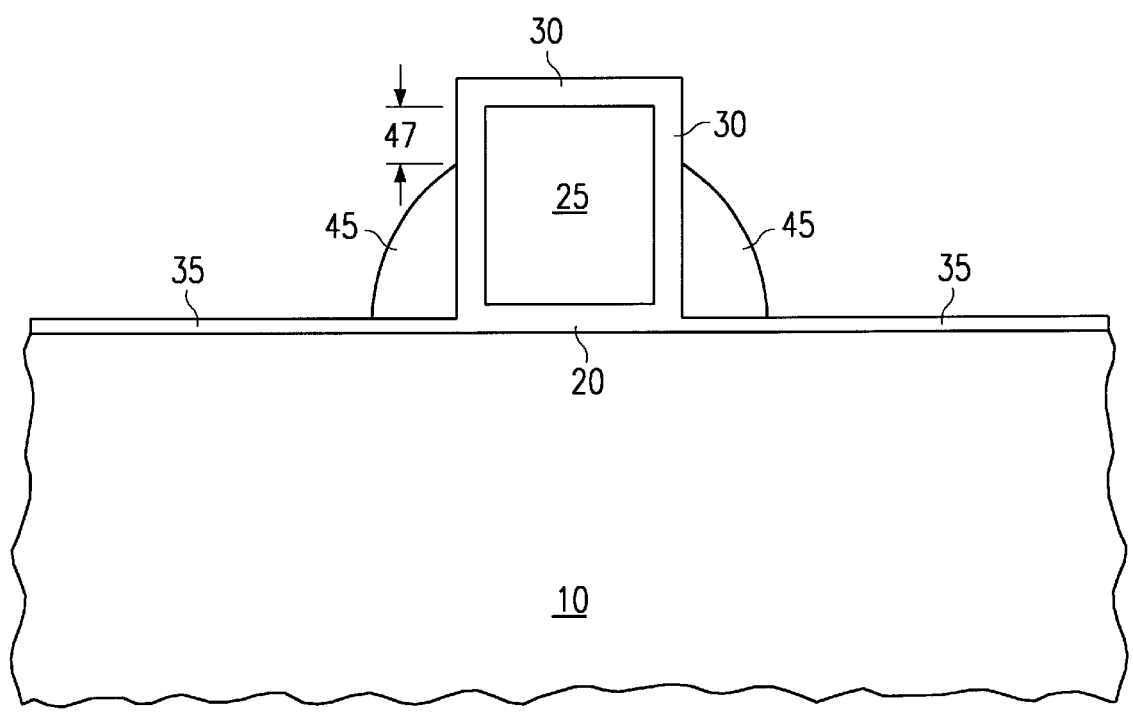
FIGS. 3A–3C are cross-sectional diagrams illustrating a further embodiment of the instant invention.
Figure 3B:
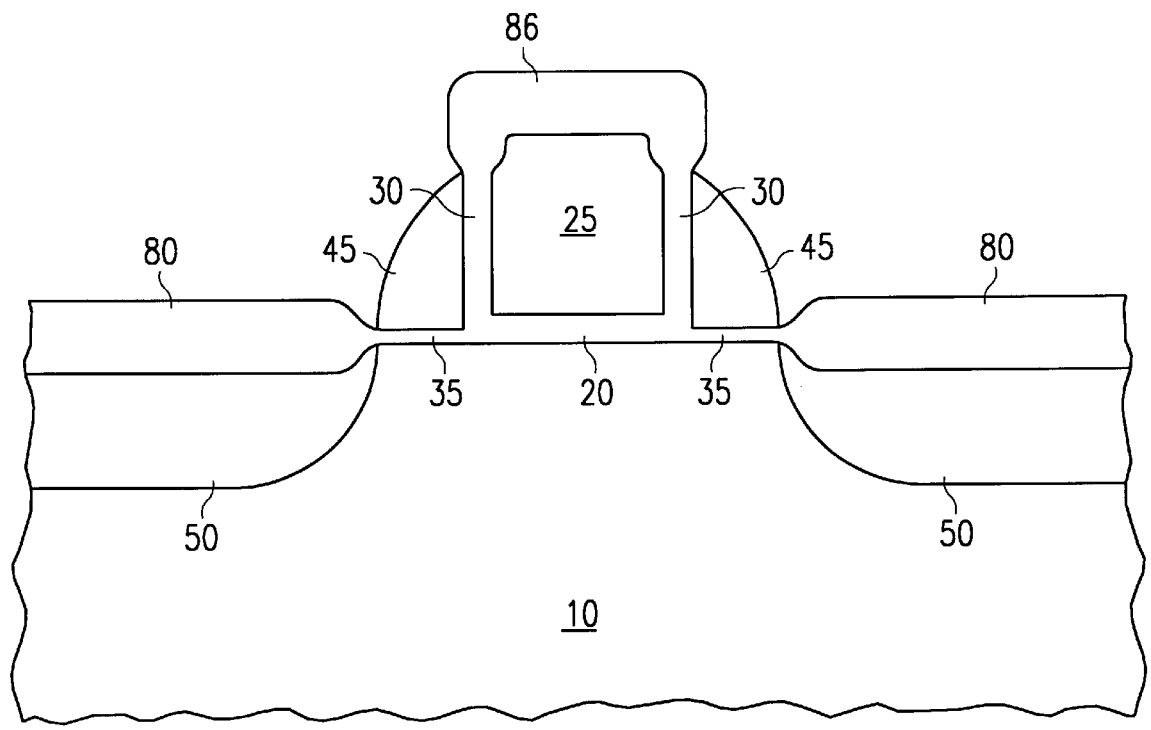
Figure 3C:
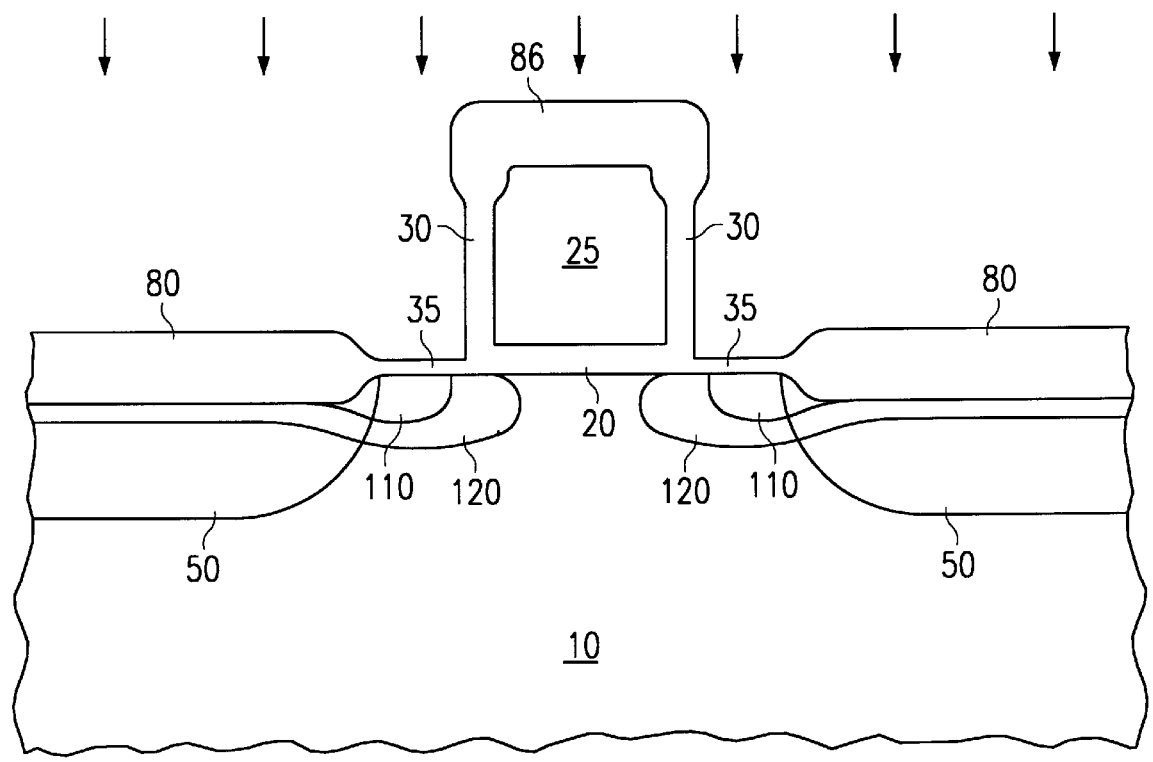

Illustrated in FIGS. 3A–3C is another embodiment of the instant invention. In FIG. 3A, the gate dielectric 20 comprises silicon dioxide, silicon nitride, silicon oxynitride or a suitable dielectric film. As described above, the transistor gate structure 25 is formed by first depositing a blanket film of polycrystalline silicon followed by pattern and etch steps resulting in the structure shown. Following the formation of the gate structure 25, an oxide film is formed on the gate structure 30 and on the substrate 35 by heating the structure in an oxidizing ambient, by depositing the film, or with a combination of both processes. In an embodiment, the film thickness of 30 and 35 will be between 30 A and 50 A, more preferably about 40 A. The sidewall structures 40 are formed using silicon nitride or other suitable insulators. In the case of silicon nitride, the structures 45 are formed by first depositing a blanket silicon nitride film followed by an anisotropic silicon nitride etch. This anistropic etching in continued until the top of the silicon nitride sidewall structure 45 is beneath the top surface of the gate structure 35 shown by 47 in FIG. 3A. In an embodiment of the instant invention, the top of the sidewall 45 will be about 100 A–200

A beneath the top surface of the gate structure 25 and more preferably about 200 A.

Subsequent to the formation of the sidewall structure 45, the structure shown in FIG. 3A is heated in an oxidizing ambient to produce the LOCOS type silicon oxide region 80 shown in FIG. 2B. The silicon oxide region 86 will also be formed during this process. In regions of the substrate covered by the sidewall structure 45 and the gate structure 25, no additional silicon oxide will be formed. In an embodiment of the instant invention, the thickness of the LOCOS type silicon oxide region 80 will be between 150 A and 200 A and more preferably about 200 A. In this embodiment, silicon oxide formation will take place both on the top surface of the gate structure 25 as well as the side surface not covered by the sidewall structure 45. Thus the silicon oxide region 86 formed on the gate polycrystalline silicon structure 25 will extend over the sidewall structure as shown in FIG. 3B. The silicon oxide region 86 will be between 150 A and 200 A and more preferably about 200 A. The silicon oxide region 86 will function as an offset spacer during the subsequent drain extension and pocket implant processes. Following the formation of regions 80 and 86, the structure is implanted with dopant species to form the source and drain regions 50. For a p-type substrate 10, n-type dopant species such as arsenic, phosphorous, or a combination of both can be used. For an n-type substrate 10, a boron-containing ion can be used. Following the implants to form the source and drain regions 50, a high temperature thermal anneal is performed to activate the implanted species.

As shown in FIG. 3C, following the formation of the source and drain regions 50 in FIG. 3B, the sidewall structures 45 are removed using a highly selective silicon nitride to silicon oxide etch. This high selective etch is necessary to minimize the silicon oxide loss from regions 80 and 86 during this process. Following the removal of the sidewall structures 45, the drain extension implants and the pocket implants are performed resulting in the formation of the drain extension region 110 and the pocket region 120 respectively. For a p-type substrate 10, n-type species such as arsenic and phosphorous and be used to form the drain extension region 110 and a p-type species such as a boron containing ion can be used to form the pocket region 120. If a n-type substrate 10 is used, a p-type species such a boron containing ion can be used to form the drain extension region 110 and n-type species such as arsenic or phosphorous can be used to form the pocket region 120. Following the implantation processes used to form regions 110 and 120, a low temperature anneal (or a rapid thermal anneal) is performed to activate the dopants.

The presence of the thick LOCOS type silicon oxide region 80 during the drain extension and pocket implants will cause the depth of the drain extension region 110 and the pocket region 120 to decrease in regions of the substrate beneath the LOCOS type region 80. In addition to the reduction in depth, the concentration of regions 110 and 120 will be reduce d in regions of the substrate 10 beneath oxide region 80 due to the loss of dopant species in this thicker oxide region 80. Due to t he localized nature of oxide region 80, this region 80 will essentially cover the source and drain regions 50. The reduction in the depth and concentration of the drain extension region 110 and the pocket region 120 in the source and drain regions 50 (i.e., beneath the oxide region 80) will result in a reduction in the capacitance associated with these regions. This reduced capacitance will lead to improved performance in the resulting transistor structure. In addition, silicon oxide region 86 will function as an offset spacer for the drain extension implant. This is important for very short transistor gate lengths to minimize the overlap of the drain extension region 110 and the transistor gate 25. This reduction in drain extension gate overlap allows for an increase in dose and energy of the drain extension implant resulting in a reduction in source drain resistance.

Figure 4A:
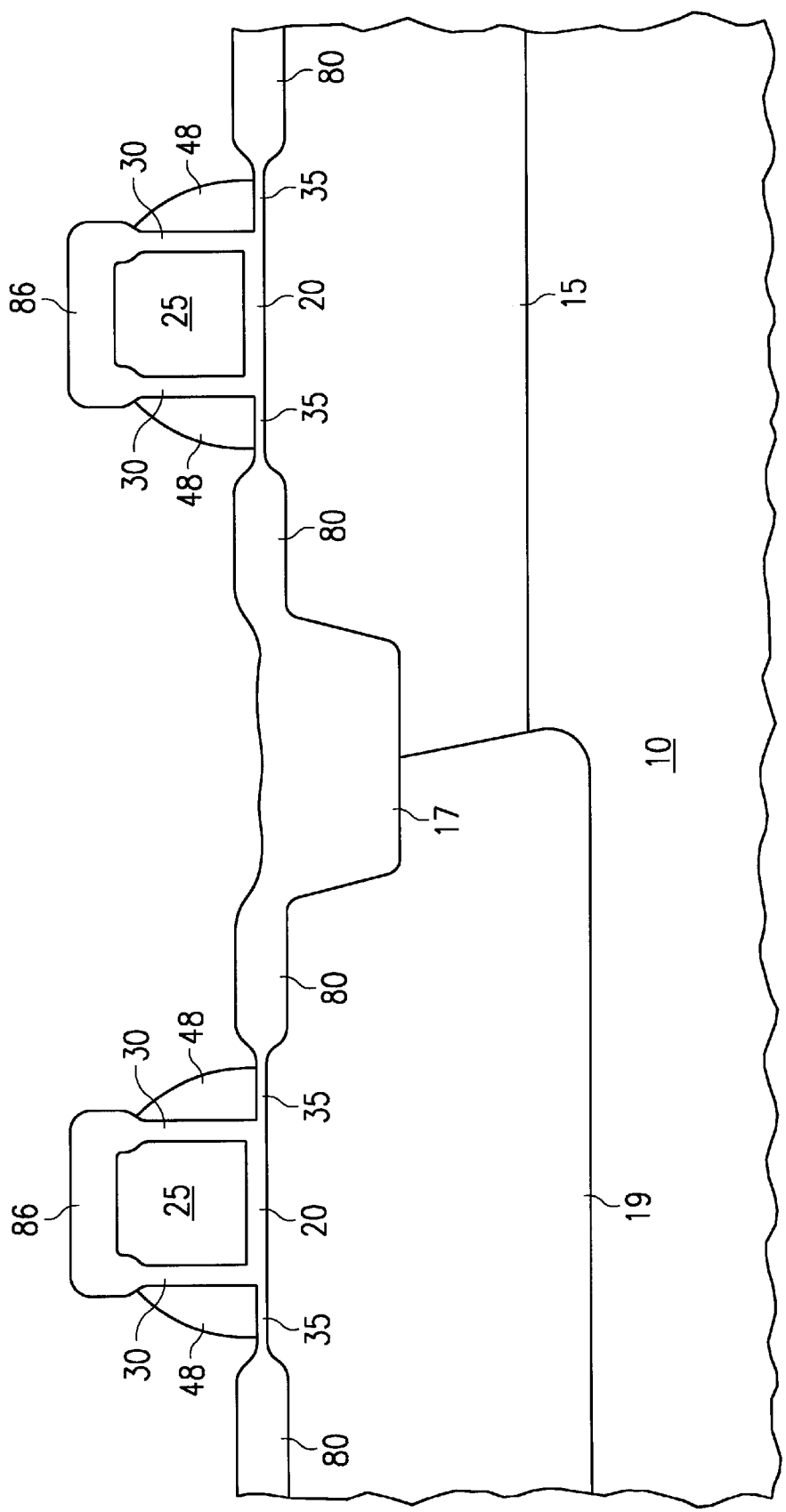
FIGS. 4A–4C are cross-sectional diagrams illustrating a further embodiment of the instant invention.
Figure 4B:
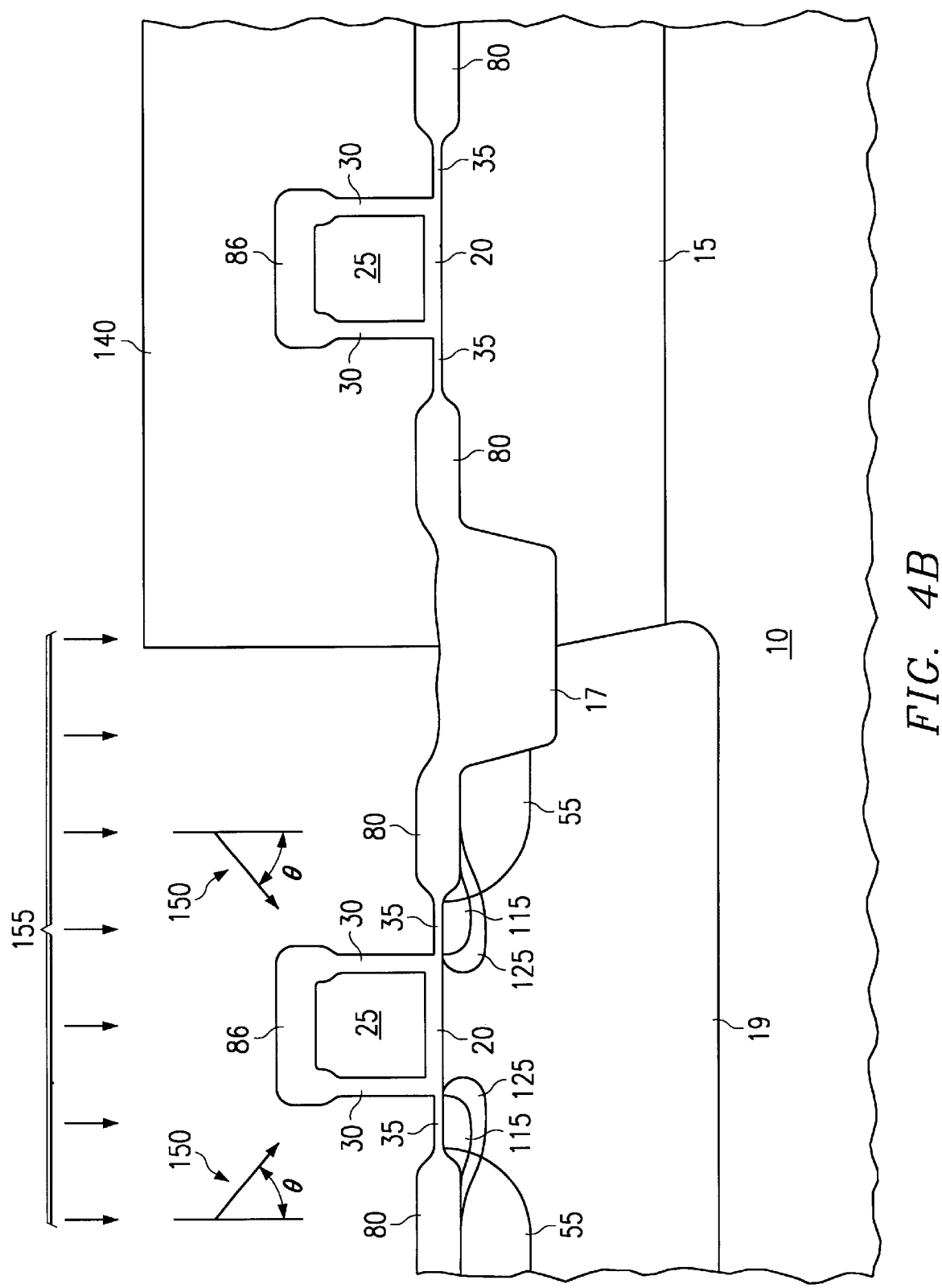
Figure 4C:
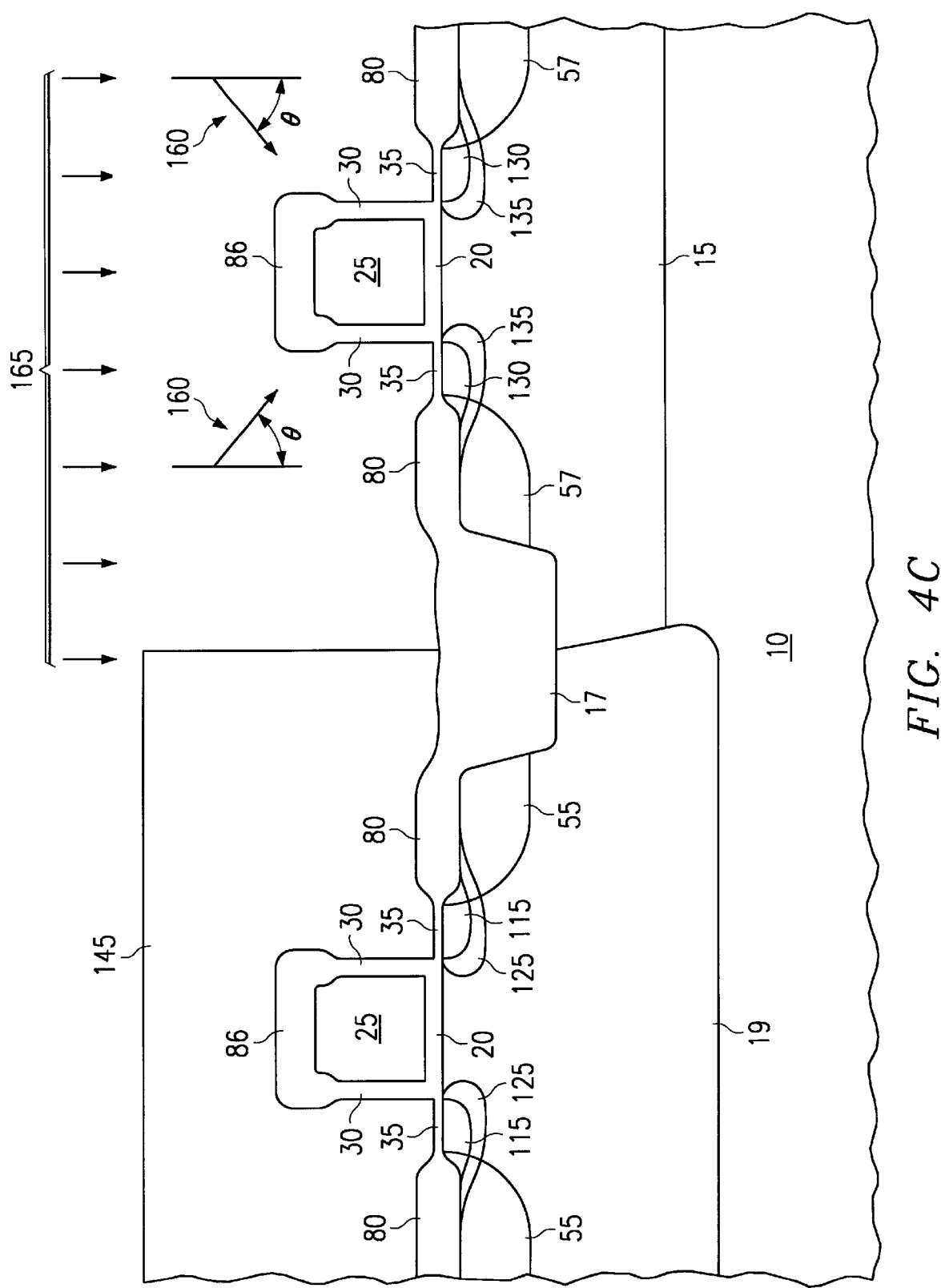

In very short gate length transistors, the width of the sidewall required for proper source and drain formation will be reduced. For the case of a sidewall width less than 300 A, an embodiment of the instant invention is shown in FIGS. 4A–4C. As shown in FIG. 4A, the method will be described with reference to a twin well type CMOS process. It should be noted however, that the method is not limited to a twin well process but is applicable to a wide array of MOS transistor devices and circuits. Using standard CMOS processing techniques, a p-well region 15 and a n-well region 17 are formed in the silicon substrate 10. The isolation region 17 is comprised of silicon oxide and is formed using standard processing methods for forming the shallow trench isolation (STI) structure 17. The gate dielectric 20 comprises silicon dioxide, silicon nitride, silicon oxynitride or a suitable dielectric film. As described above, the transistor gate structure 25 is formed by first depositing a blanket film of polycrystalline silicon followed by pattern and etch steps resulting in the structure shown. Following the formation of the gate structure 25, an oxide film is formed on the gate structure 30 and on the substrate 35 by heating the structure in an oxidizing ambient, by depositing the film, or with a combination of both processes. In an embodiment, the film thickness of 30 and 35 will be between 30 A and 50 A, more preferably about 40 A. The sidewall structures 48 are formed using silicon nitride or other suitable insulators. In the case of silicon nitride, the structures 48 are formed by first depositing a blanket silicon nitride film followed by an anisotropic silicon nitride etch. This anisotropic etching in continued until the top of the silicon nitride sidewall structure 48 is beneath the top surface of the gate structure 25. In an embodiment of the instant invention, the top of the sidewall 45 will be about 100 A–300 A beneath the top surface of the gate structure 25 and more preferably about 250 A. Subsequent to the formation of the sidewall structure 48, the structure is heated in an oxidizing ambient to produce the LOCOS type silicon oxide region 80. The silicon oxide region 86 will also be formed during this process. In regions of the substrate covered by the sidewall structure 48 and the gate structure 25, no additional silicon oxide will be formed. In an embodiment of the instant invention, the thickness of the LOCOS type silicon oxide region 80 will be between 150 A and 350 A and more preferably about 250 A. In this embodiment, silicon oxide formation will take place both on the top surface of the gate structure 25 as well as the side surface not covered by the sidewall structure 48. Thus the silicon oxide region 86 formed on the gate polycrystalline silicon structure 25 will extend over the sidewall structure as shown in FIG. 4A. The silicon oxide region 86 will be between 150 A and 350 A and more preferably about 250 A.

As illustrated in FIG. 4B, the sidewall structures 48 are removed using a highly selective silicon nitride to silicon oxide etch. This high selective etch is necessary to minimize the silicon oxide loss from regions 80 and 86 during this process. Following the removal of the sidewall structures, a photoresist film is formed and patterned 140 to mask the gate structure over the p-well and expose the gate structure over the n-well 19 where the PMOS transistor will be formed. With the patterned photoresist film 140 in place, the structure is implanted with dopant species to form the source and drain regions 55, the drain extension region 115 and the pocket region 125. For the n-well region 19, a boron-containing ion is used to form the source drain region 55. This is a zero degree implant which is offset from the gate 25 by the oxide spacer 86. In this embodiment, both the drain extension implant and the pocket implant will be performed at an angle Φ as illustrated by 150. In addition to the angled implant, some type of rotation (usually a four-way rotation) is also applied to the implant process. The pocket implant comprise a n-type species such as arsenic or phosphorous and the drain extension implant will comprise a p-type species such as a boron containing ion. Following the formation of the drain extension region 115 and the pocket region 125 for the PMOS transistor, 155 in FIG. 4B, the patterned photoresist is removed and a new photoresist film is patterned 145 to mask the n-well region and expose the area in the p-well region 15 where the NMOS transistor will be fabricated 160.

With the patterned photoresist film 145 in place, the structure is implanted with dopant species to form the source and drain regions 57, the drain extension region 130 and the pocket region 135. For the p-well region 15, a n-type species such as arsenic or phosphorous is used to form the source drain region 57. This is a zero degree implant which is offset from the gate 25 by the oxide spacer 86. In this embodiment, both the drain extension implant and the pocket implant will be performed at an angle θ as illustrated by 160. In addition to the angled implant, some type of rotation (usually a four-way rotation) is also applied to the implant process. The drain extension implant comprise a n-type species such as arsenic or phosphorous and the pocket implant will comprise a p-type species such as a boron containing ion. Following the removal of the patterned film 145, the transistors can be completed using standard silicon integrated circuit processing.

In addition to having low capacitance due to the contouring of the drain extension regions and the pocket regions in the source drain regions, this embodiment has the additional advantage of reducing the number of masks required. Here a single mask is utilized to form the source drain region, the drain extension region and the pocket region as compared to the two-mask process currently in use.

I claim:

1. A method for forming a MOS transistor, comprising:
   providing a semiconductor substrate with an upper surface;
   forming a gate dielectric on said semiconductor substrate;
   forming a gate structure on said gate dielectric with a plurality of side surfaces and a top surface;
   forming a first insulator film of a first thickness on said plurality of side surfaces, said top surface, and said upper surface of said substrate;
   forming a plurality of sidewall structures against said first insulator film on said plurality of side surfaces wherein said sidewall structure covers a portion of said first insulator film over said upper surface of said substrate;
   forming a LOCOS type insulator film of a second thickness on said upper surface of said semiconductor substrate wherein said second thickness is greater than said first thickness and said LOCOS type insulator film is formed by thermal oxidation of said first insulator film.

2. The method of claim 1 further comprising:
   forming a source drain region beneath said LOCOS type insulator film by implanting a first dopant species; and
   removing said plurality of sidewall structures.

3. The method of claim 2 further comprising, forming a drain extension region and a pocket region by implanting said first dopant species and a second dopant species respectively.

4. The method of claim 1 wherein said first insulator film is silicon oxide.

5. The method of claim 1 wherein said LOCOS type insulator film is silicon oxide.

6. The method of claim 1 wherein said first thickness of said first insulator film is between 30 A and 50 A.

7. The method of claim 1 wherein said second thickness of said LOCOS type insulator film is about 150 A to 250 A.

8. A method for forming a MOS transistor, comprising:
   providing a semiconductor substrate with an upper surface;
   forming a gate dielectric on said semiconductor substrate;
   forming a gate structure of a first height on said gate dielectric with a plurality of side surfaces and a top surface;
   forming a first insulator film of a first thickness on said plurality of side surfaces, said top surface, and said upper surface of said substrate;
   forming a plurality of sidewall structures with a second height against said first insulator film on said plurality of side surfaces wherein said sidewall structure covers a portion of said first insulator film over said upper surface of said substrate and wherein said second height is less than said first height;
   forming a LOCOS type insulator film of a second thickness on said upper surface of said semiconductor substrate wherein said second thickness is greater than said first thickness and said LOCOS type insulator film is formed by thermal oxidation of said first insulator film; and
   forming a spacer structure on said top surface of said gate structure and on said plurality of side surfaces of said gate structure above said sidewall structure of a second height wherein said spacer structure is formed by thermal oxidation of said first insulator film.

9. The method of claim 8 further comprising:
   forming a source drain region beneath said LOCOS type insulator film by implanting a first dopant species;
   removing said plurality of sidewall structures; and
   forming a drain extension region and a pocket region by implanting said first dopant species and a second dopant species respectively.

10. The method of claim 8 wherein said spacer structure is silicon oxide.

11. The method of claim 8 wherein said spacer structure is between 150 A and 250 A thick.

12. The method of claim 8 wherein said first insulator film is silicon oxide.

13. The method of claim 8 wherein said LOCOS type insulator film is silicon oxide.

14. The method of claim 8 wherein said first thickness of said first insulator film is between 30 A and 50 A.

15. The method of claim 8 wherein said second thickness of said LOCOS type insulator film is about 150 A to 250 A.

16. A method for forming a MOS transistor, comprising:
   providing a semiconductor substrate with an upper surface;
   forming a gate dielectric on said semiconductor substrate;
   forming a gate structure of a first height on said gate dielectric with a plurality of side surfaces and a top surface;

forming a first insulator film of a first thickness on said plurality of side surfaces, said top surface, and said upper surface of said substrate;

forming a plurality of sidewall structures with a second height against said first insulator film on said plurality of side surfaces wherein said sidewall structure covers a portion of said first insulator film over said upper surface of said substrate and wherein said second height is less than said first height;

forming a LOCOS type insulator film of a second thickness on said upper surface of said semiconductor substrate wherein said second thickness is greater than said first thickness and said LOCOS type insulator film is formed by thermal oxidation of said first insulator film;

forming a spacer structure on said top surface of said gate structure and on said plurality of side surfaces of said gate structure above said sidewall structure of a second height wherein said spacer structure is formed by thermal oxidation of said first insulator film;

removing said plurality of sidewall structures;

performing a source drain implant to form a source drain region; and performing a drain extension implant to form of a drain extension region.

17. The method of claim 16 further comprising performing a pocket implant to form a pocket region.

18. The method of claim 16 wherein said drain extension implant is an angled implant.

19. The method of claim 16 wherein said source drain implant is zero degree implant.

20. A transistor gate and spacer, comprising:

a gate dielectric film on a semiconductor substrate;

a gate structure on said gate dielectric film said gate structure having a top surface and a plurality of side surfaces with said side surfaces having an upper portion and a lower portion adjacent to said gate dielectric film; and a continuous insulator film on said gate structure with said insulator film having a first thickness on said lower portion of said plurality of sidewall surfaces and a second thickness on said upper portion of said sidewall surfaces and on said top surface wherein said second thickness is greater than said first thickness.

21. The transistor gate and spacer of claim 20 wherein said second thickness is about 150 A to 250 A.

22. The transistor gate and spacer of claim 20 wherein said first thickness is about 30 A to 50 A.

23. The transistor gate and spacer of claim 20 wherein said second thickness is about four time said first thickness.

* * * * *